May 27, 1969

F. C. BENNETT 3,447,091

VARIABLE GAIN WIDE BAND BANDPASS AMPLIFIER

Filed Nov. 21, 1966

INVENTOR
Frank Colston Bennett
BY
Baldwin Wight Diller & Brown
ATTORNEYS

United States Patent Office 3,447,091

Patented May 27, 1969

3,447,091

VARIABLE GAIN WIDE BAND BANDPASS AMPLIFIER

Frank Colston Bennett, Essex, England, assignor to The Marconi Company Limited, London, England, a British company Filed Nov. 21, 1966, Ser. No. 595,668

Claims priority, application Great Britain, Jan. 17, 1966, 2,056/66

Int. Cl. H03f *3/04, 3/42*

U.S. Cl. 330—18 3 Claims

ABSTRACT OF THE DISCLOSURE

A variable gain wide band bandpass amplifier including at least one variable gain stage has a pair of transistors in cascode connection and coupled to one another by direct current coupling and a resistor in a compensating direct current path extending from the coupling circuit to a point of anchored potential which provides a desired degree of stabilization of the current through the second of the two transistors of said stage.

Figure 1:
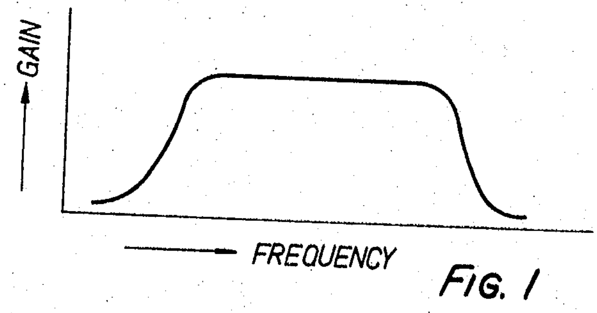

This invention relates to wide band bandpass amplifiers and has for its object to provide improved variable gain bandpass amplifiers of wide pass band the gain of which can be varied without seriously changing the shape of the gain/frequency bandpass characteristic. The principal application of the invention is to provide intermediate frequency wide bandpass amplifiers.

The problem of providing a variable gain wide bandpass amplifier which, when its gain is varied, will maintain, without serious change, the shape of its gain/frequency characteristic is a difficult one to solve satisfactorily. In the case of a narrow band amplifier it is normal practice to mask undesired variations by using, in the interstage coupling circuits, tuning capacitors of high capacitance in conjunction with damping resistors of effectively low values. This expedient obviously results in loss of available gain over the band and therefore, though acceptable in narrow band amplifiers, is not satisfactorily applicable to wide band amplifiers.

An expedient often adopted for wide band amplifiers is to provide diode units connected in attenuator networks before and/or between the stages of and/or after the amplifier, the attenuation being controlled by varying control voltages applied to the diodes. This expedient has, however, the defects of being costly in practice, involving a minimum insertion loss (due to the network) which has to be made good by increased gain in the amplifier; involving an increase in noise so that noise in the amplifier may easily be large enough to become the determining factor in the signal/noise ratio of a system incorporating the amplifier; and, because of the stray capacitances associated with the diodes, exhibiting attenuation which is frequency sensitive with resultant distortion of the overall pass band.

According to this invention a variable gain wide band bandpass amplifier includes at least one variable gain stage comprising a pair of transistors in cascode connection and coupled to one another by direct current coupling and a compensating direct current path extending from the coupling circuit to a point of anchored potential and providing a desired degree of stabilization of the current through the second of the two transistors of said stage.

Preferably said stage consists of two transistors in cascode connection with the collector of the first directly connected to the emitter of the second, a resonant circuit in the collector circuit of the second transistor, means for applying signals to be amplified to the base of the first transistor, means for applying variable gain controlling potential to the emitter of the first transistor, a compensating resistance connected between the direct connection between the two transistors and a point of anchored potential, and means for taking amplified output from the collector of the second transistor. The resonant circuit is tuned to a frequency in the lower part of the band to be passed by the amplifier as a whole and the value of the compensating resistance is preferably chosen to be such as to provide less than complete stabilization of the current through the second transistor. The actual best value of compensating resistance depends on the type of transistor employed and on the intended operating frequency but the value is not critical and once chosen for a particular design of stage for a particular frequency there is no difficulty in making such stages in numbers to give substantially the same performance.

A preferred form of band pass amplifier in accordance with this invention comprises at least one variable gain cascode connected stage as above set forth and having its tuned circuit resonant at a frequency in the lower part of the band to be passed and at least one other cascode connected stage which is similar except that its resonant circuit is resonant at a frequency in the upper part of the band to be passed and no variable gain controlling potential is applied thereto, the stages being directly or indirectly in cascade with one another. Thus, for example, there could be two variable gain controlled stages and another stage, uncontrolled as to gain, all three being in cascade, the same variable gain controlling potential being applied to the first and third stages and the three stages having their resonant circuits tuned respectively to different frequencies in the band to be passed, the resonant circuits of the gain controlled stages being tuned to the two lower of the three frequencies. Again, for example, the amplifier could have four (or some other even number) of stages, half of them gain controlled and tuned to a frequency towards one end of the band and the other half of them without gain control and tuned to a frequency towards the other end of the band.

Figure 2:
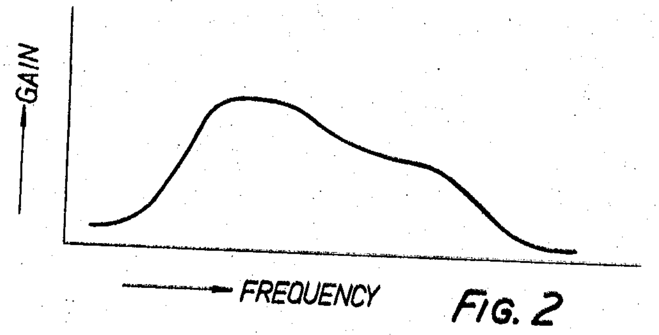
Figure 3:
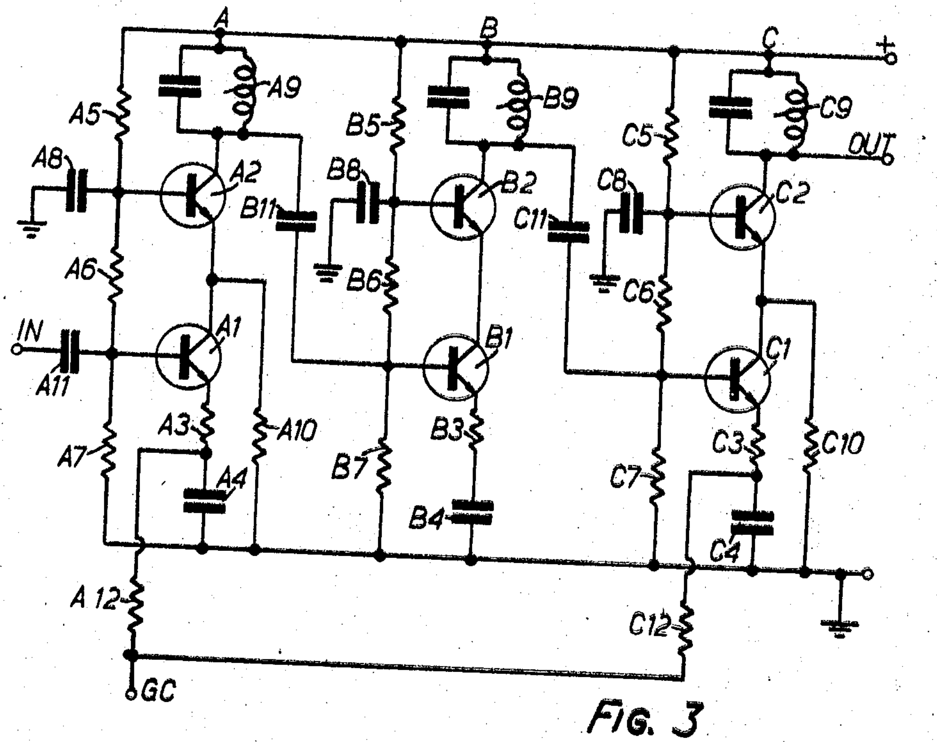

The invention is illustrated in and further explained in connection with the accompanying drawings in which FIGURES 1 and 2 are explanatory graphical figures and FIGURE 3 is a diagram of a preferred embodiment.

FIGURE 1 shows a gain/frequency characteristic such as would normally be desired for a wide band bandpass amplifier. Now consider a known cascade connected transistor stage the transistors of which are direct current coupled and wherein a tuned circuit is in the collector circuit of the second transistor. With such a known stage, variation of gain by varying the current through the first transistor will also cause variation of the current passed by the second transistor. The gain of the stage will vary but it will be accompanied by a variation in the output resistance of the second transistor. This will cause a narrowing of the bandwidth of the tuned circuit as the current is reduced by gain control adjustment to reduce gain. If the resonant circuit is tuned to a frequency in the lower part of a band to be passed by an amplifier which includes the aforesaid stage in cascade with another, similar, stage having its resonant circuit tuned to a frequency in the upper part of the band to be passed, the result will be to produce a distorted overall gain/frequency characteristic as typified by FIGURE 2. This distortion can be avoided, in accordance with the present invention, by providing a compensating resistance which stabilizes, to a desired degree, the current passed by the aforesaid second transistor and compensates, to a desired degree, for the reduction in current through it which would otherwise accompany variation of gain control to reduce gain.

FIGURE 3 shows a preferred form of three stage amplifier in accordance with the invention. The three stages are indicated by the reference leters A, B and C marked above them. The three stages are generally similar except that stages A and C are gain controlled but stage B is not and the three stages are tuned to different frequencies spaced over the band to be passed, stages A and C being tuned to the two lower of these three frequencies and stage B being tuned to the highest of the three. Similar reference numerals, preceded by the appropriate letter A, B or C are employed for similar elements in the three stages. In order to shorten the description which follows, the stage identifying letters preceding the reference numerals will be omitted, only the numerals being referred to.

Referring to FIGURE 3 each stage comprises two transistors 1, 2 in cascode connection, with the collector of the first directly connected to the emitter of the second. The emitter of transistor 1 is connected to earth through a resistance 3 in series with a condenser 4 and, in the cases of stages A and C above, variable gain controlling potential is applied through resistance 12 at the junction point of elements 3 and 4. The same variable gain controlling potential, applied at terminal GC, is fed to both stages A and C. The bases of the transistors 1 and 2 are suitably tapped upon a potentiometer consisting of resistances 5, 6 and 7 in series across the supply terminals. The base of transistor 2 is earthed through a condenser 8 and input signals are applied at IN through condenser 11 to the base of transistor 1 in stage A. The collector circuit of transistor 2 includes a tuned circuit 9 which, in the case of stages A and C, are tuned to the lower and middle of three frequencies spaced over the band to be passed by the amplifier and in the case of stage B is tuned to the remaining frequency in the upper part of said band. In this way the tuning is staggered, in accordance with practice well known per se, to obtain a wide overall response band. In the case of the gain controlled stages A and C there is provided, in accordance with this invention a compensating resistance 10, for stabilizing to a desired extent the current through transistor 2, this resistance being connected between earth and the junction point of the collector of transistor 1 with the emitter of transistor 2. The collector of transistor 2 of stage A is capacity coupled by a condenser 11 to the base of transistor 1 of stage B; stages B and C are similarly coupled in cascade; and output from the amplifier is taken at OUT from the collector of transistor 2 of stage C.

In a practical experimental amplifier as shown in FIGURE 3 and designed to pass a bandwidth of 70 mc./s. centered at 90 mc./s., the resistance 10 had a value of 18000 ohms. It was found that a gain control range of 50 db was obtainable with gain/frequency characteristic shape variations of less than ±0.5 db.

I claim:

1. A variable gain wide band bandpass amplifier including two transistors in cascode connection with the collector of the first transistor directly connected to the emitter of the second transistor, a resonant circuit in the collector circuit of the second transistor, means for applying signals to be amplified to the base of the first transistor, means for applying variable gain controlling potential to the emitter of the first transistor, a compensating direct current path including compensating resistance means connected between the direct connection between the two transistors and a point of anchored potential for providing a degree of stabilization of the current through the second of the two transistors of said stage, and means for taking amplified output from the collector of the second transistor.

2. An amplifier as claimed in claim 2 wherein the resonant circuit is tuned to a frequency in the lower part of the band to be passed by the amplifier as a whole and the value of the compensating resistance is chosen to be such as to provide less than complete stabilization of the current through the second transistor.

3. A variable gain wide band bandpass amplifier including at least one variable gain stage comprising a pair of transistors in cascade connection, a coupling circuit coupling said pair of transistors to one another by direct current coupling and a compensating direct current path extending from the coupling circuit to a point of anchored potential and providing a desired degree of stabilization of the current through the second of the two transistors of said stage, a tuned circuit resonant at a frequency in the lower part of the band to be passed, said amplifier further including at least one other cascode connected stage which is similar to said at least one stage and having a resonant circuit resonant at a frequency in the upper part of the band to be passed and means for applying a variable gain controlling potential to said at least one variable gain stage, the stages being effectively coupled in cascade with one another.

References Cited

UNITED STATES PATENTS

| | | | |
|---|---|---|---|
| 2,926,307 | 2/1960 | Ehret | 330—18 |
| 3,177,439 | 4/1965 | Tulp et al. | 330—18 |

FOREIGN PATENTS 909,776 11/1962 Great Britain.

ROY LAKE, *Primary Examiner.*

S. H. GRIMM, *Assistant Examiner.*

U.S. Cl. X.R.

330—21, 29, 31